(12) United States Patent
Shirasaki

(10) Patent No.: US 12,456,790 B2
(45) Date of Patent: Oct. 28, 2025

(54) ELECTRONIC ELEMENT STORING PACKAGE AND ELECTRONIC DEVICE

(71) Applicant: KYOCERA Corporation, Kyoto (JP)

(72) Inventor: Takayuki Shirasaki, Kirishima (JP)

(73) Assignee: KYOCERA Corporation, Kyoto (JP)

( * ) Notice: Subject to any disclaimer, the term of this patent is extended or adjusted under 35 U.S.C. 154(b) by 130 days.

(21) Appl. No.: 18/576,922

(22) PCT Filed: Jul. 8, 2022

(86) PCT No.: PCT/JP2022/027050
§ 371 (c)(1),
(2) Date: Jan. 5, 2024

(87) PCT Pub. No.: WO2023/282340
PCT Pub. Date: Jan. 12, 2023

(65) Prior Publication Data
US 2024/0258674 A1 Aug. 1, 2024

(30) Foreign Application Priority Data
Jul. 9, 2021 (JP) .................... 2021-114216

(51) Int. Cl.
*H01P 5/08* (2006.01)
*H03H 7/38* (2006.01)

(52) U.S. Cl.
CPC ............. *H01P 5/08* (2013.01); *H01P 5/085* (2013.01); *H03H 7/38* (2013.01)

(58) Field of Classification Search
CPC .. H01P 5/085; H01P 5/08; H03H 7/38; H03H 7/383
See application file for complete search history.

(56) References Cited

U.S. PATENT DOCUMENTS

2019/0020091 A1* 1/2019 Wakita ................... H01R 13/62
2024/0195142 A1* 6/2024 Shirasaki ................ H01S 5/022

FOREIGN PATENT DOCUMENTS

JP 2003-100927 A 4/2003

* cited by examiner

*Primary Examiner* — Stephen E. Jones
(74) *Attorney, Agent, or Firm* — Volpe Koenig

(57) ABSTRACT

A coaxial line includes a central conductor long in one direction, an outer peripheral conductor, and a dielectric located therebetween and having a first end face facing a transmission line. A wall body includes an opening leading to the first end face and including an annular space contacting the first end face. An outer diameter of the annular space is larger than that of a space opposite the first end face in the opening. The central conductor includes a first section having a first thickness and at least partially projecting from the first end face and a second section having a second thickness smaller than the first thickness and located within the dielectric; an end of the first section on an anti-projection side is located between the first end face and a specific position within the dielectric in a longitudinal direction of the central conductor.

5 Claims, 11 Drawing Sheets

ELECTRONIC ELEMENT STORING PACKAGE AND ELECTRONIC DEVICE

TECHNICAL FIELD

The present disclosure relates to an electronic element storing package and an electronic device.

BACKGROUND OF INVENTION

Japanese Unexamined Patent Application Publication No. 2003-100927 describes a semiconductor element storing package including a coaxial connector located in its frame body and a circuit substrate located on a side of the frame body. The circuit substrate includes a transmission line, and a central conductor of the coaxial connector is connected to a signal conductor of the transmission line.

SUMMARY

Solution to Problem

In the present disclosure, an electronic element storing package includes a base, a coaxial line, and a transmission line. The base includes a wall body. The coaxial line is located in the wall body. The transmission line is connected to the coaxial line on a side of the wall body. The coaxial line includes a central conductor that is long in one direction, an outer peripheral conductor, and a dielectric that is located between the central conductor and the outer peripheral conductor. The dielectric has a first end face facing the transmission line. The wall body includes an opening leading to the first end face. The opening includes an annular space in contact with the first end face. An outer diameter of the annular space is larger than an outer diameter of a space located on an opposite side of the first end face in the opening. The central conductor includes a first section having a first thickness and a second section having a second thickness smaller than the first thickness and located within the dielectric, at least a part of the first section projecting from the first end face. An end of the first section on an anti-projection side is located between the first end face and a specific position within the dielectric in a longitudinal direction of the central conductor. The specific position is a position separated from the first end face toward the inside of the dielectric by ⅛ of an effective wavelength of a transmission signal.

In the present disclosure, an electronic device includes the electronic element storing package described above, and an electronic element stored in the electronic element storing package.

DESCRIPTION OF EMBODIMENTS

Each embodiment of the present disclosure will be described in detail below with reference to the attached drawings.

Figure 1A:
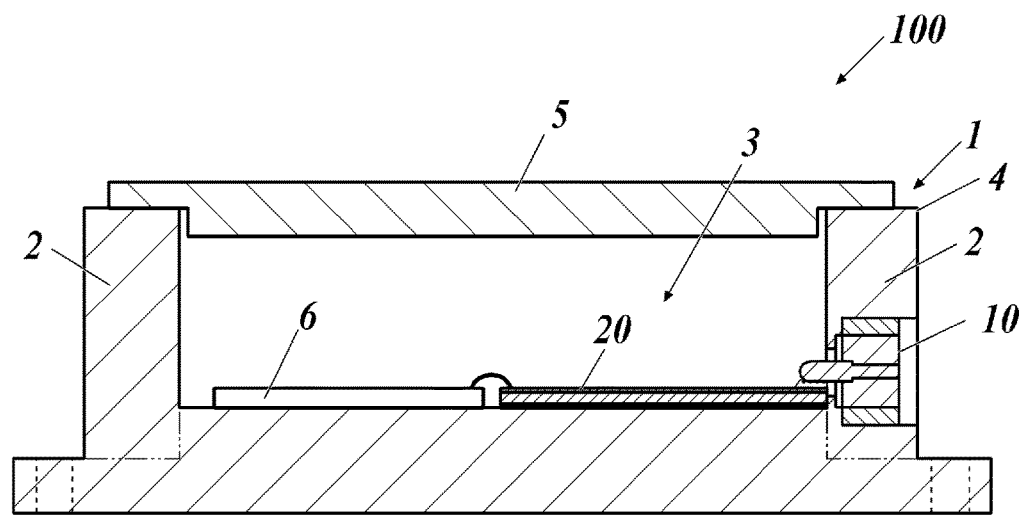
FIG. 1A is a sectional view of an electronic element storing package and an electronic device according to an embodiment of the present disclosure.
Figure 1B:
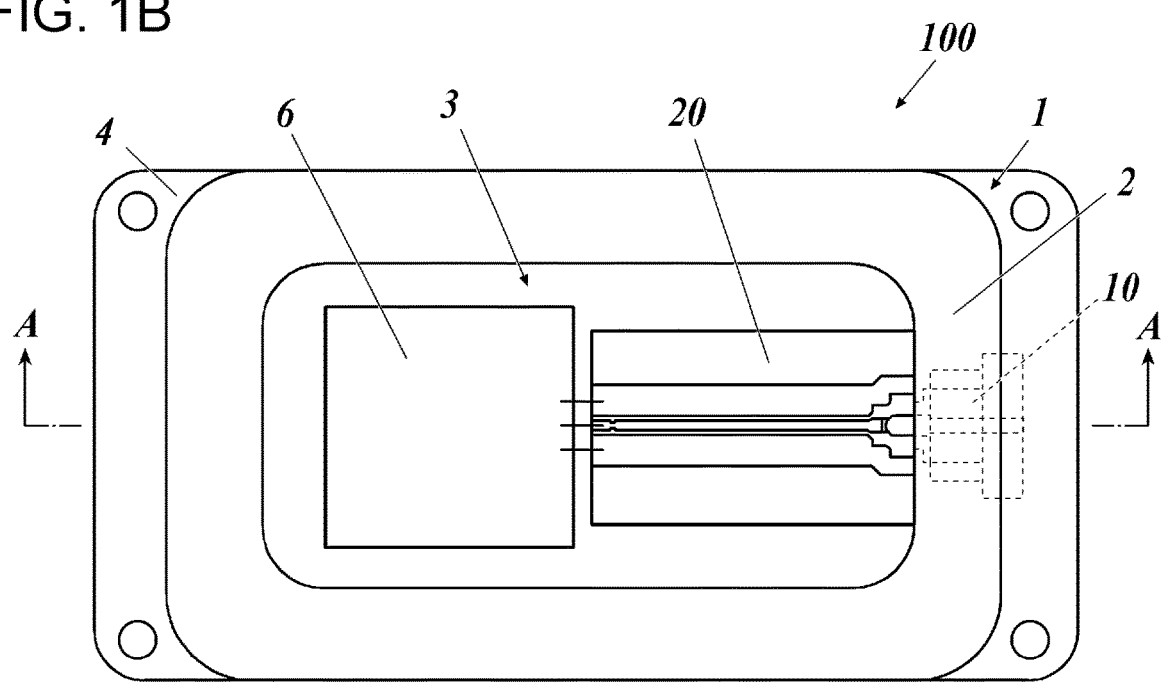
FIG. 1B is a plan view of the electronic element storing package and the electronic device according to the embodiment of the present disclosure.

FIG. 1A is a sectional view of an electronic element storing package and an electronic device according to an embodiment of the present disclosure. FIG. 1B is a plan view of the electronic element storing package and the electronic device according to the embodiment of the present disclosure. FIG. 1A illustrates a cross section taken along arrow A-A line of FIG. 1B. FIG. 1B illustrates a configuration in which a lid 5 is omitted.

An electronic device 100 according to an embodiment of the present disclosure includes an electronic element storing package 1 and an electronic element 6 stored in a storage portion 3 of the electronic element storing package 1. The electronic element 6 is an element in which a high frequency signal is input, output, or both. The electronic element 6 may be, for example, a semiconductor laser element that converts a high-frequency electrical signal into an optical signal. The electronic element 6 may be an LN (LiNbO$_3$) element that modulates a laser beam passing through an optical waveguide by a high-frequency electrical signal. The electronic element 6 is not particularly limited as long as it is an element in which a high frequency signal is input, output, or both. The frequency band of the transmitted signal is equal to or higher than 80 GHz, but the frequency band of the target transmission signal may be lower than 80 GHz.

The electronic element storing package 1 includes a base 4 that includes a wall body 2 and the storage portion 3 surrounded by the wall body 2, a coaxial line 10 that is located in the wall body 2, a transmission line 20 that is located on a side of the wall body 2, and the lid 5 that seals an opening of the storage portion 3. The base 4 may be made of metal. The base 4, including the wall body 2, may be integrally formed of a single member. Alternatively, the wall body 2 of the base 4 and a base portion (such as the bottom of the storage portion 3) of the base 4 may be formed separately and combined by fitting, joining or the like at, for example, the position indicated by the two-dotted line in FIG. 1A.

Figure 2:
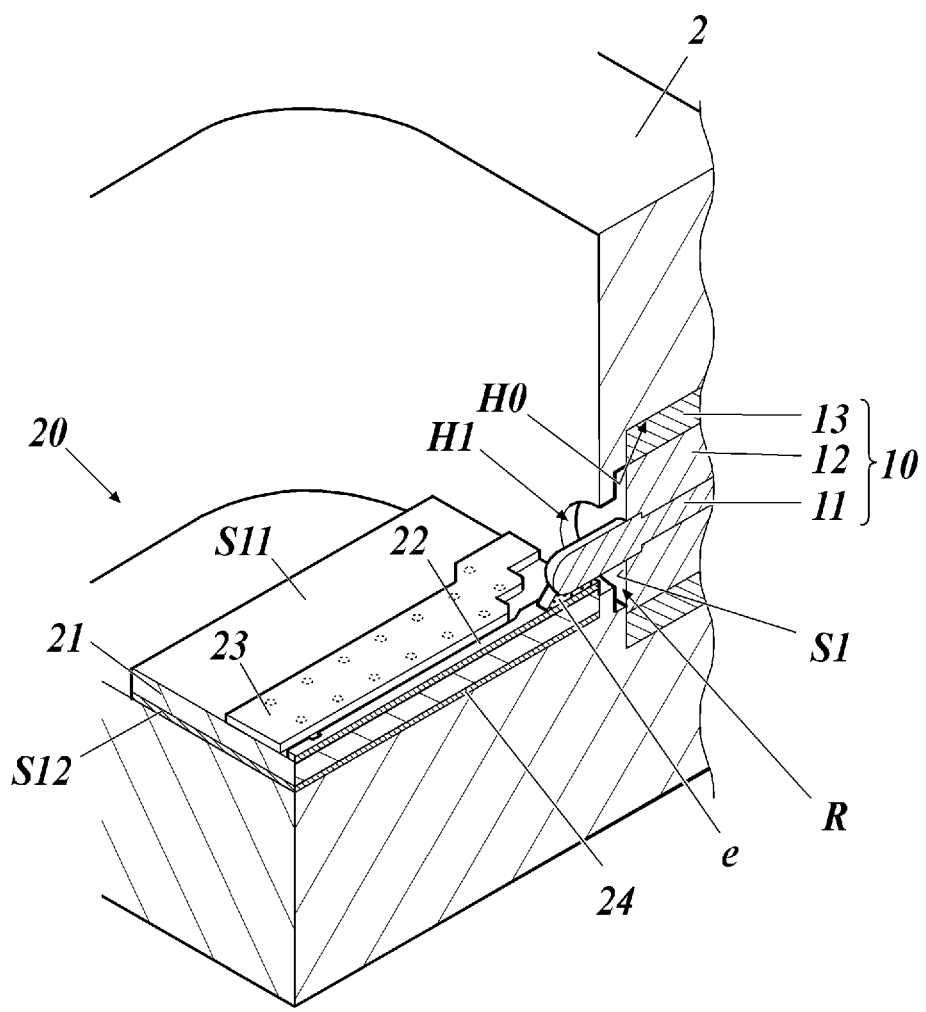
FIG. 2 is a sectional perspective view illustrating the periphery of a connection portion between a coaxial line and a transmission line of FIG. 1.
Figure 3A:
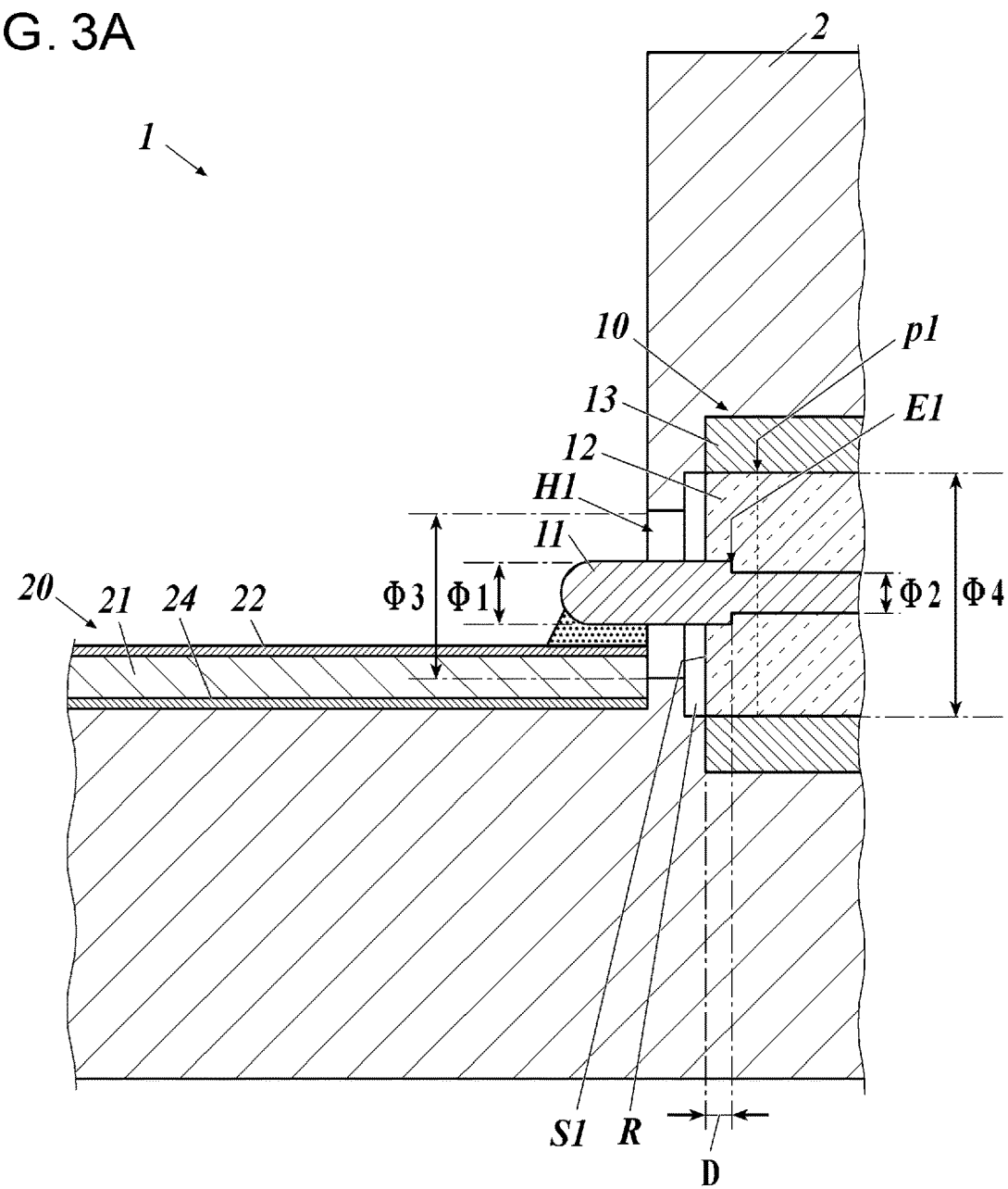
FIG. 3A is a sectional view illustrating the periphery of the connection portion between the coaxial line and the transmission line of FIG. 1.
Figure 3B:
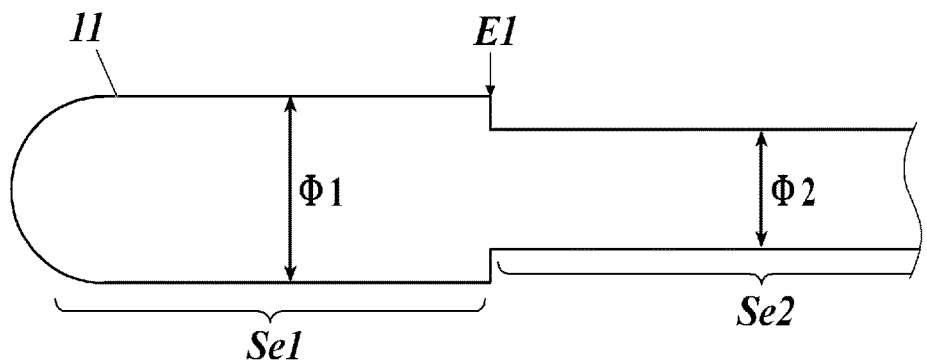
FIG. 3B is a view illustrating a central conductor of FIG. 1.

FIG. 2 is a sectional perspective view illustrating the periphery of a connection portion between the coaxial line and the transmission line. FIG. 3A is a sectional view illustrating the periphery of the above connection portion. FIG. 3B is a view illustrating a central conductor. The sectional view in FIG. 3A illustrates a cross section passing through the central axis of a central conductor 11 and perpendicular to an upper surface of the transmission line 20.

The transmission line 20 is plate-shaped and includes an insulating plate 21 (see FIG. 2) having an upper surface S11 and a lower surface S12, a signal conductor 22 located on the upper surface S11, a ground conductor 23 located on the upper surface S11 across the signal conductor 22, and a ground conductor 24 located on the lower surface S12. The insulating plate 21 is a dielectric and may be ceramic. The transmission line 20 may be called a coplanar line with a back conductor. The transmission line 20 is disposed inside the storage portion 3 but may be disposed outside the storage portion 3 on a side of the wall body 2.

As illustrated in FIGS. 2 and 3A, the coaxial line 10 includes the central conductor 11, which is a core wire long in one direction, an outer peripheral conductor 13 located radially outward from the central conductor 11, and a dielectric 12 located between the central conductor 11 and the outer peripheral conductor 13. The outer peripheral conductor 13 may have a cylindrical inner surface. When viewed from the longitudinal direction of the central conductor 11, the dielectric 12 may be located between the central conductor 11 and the outer peripheral conductor 13 over the entire circumference of the central conductor 11. When viewed from the longitudinal direction of the central conductor 11, the central conductor 11 may be located at the center of the dielectric 12. In FIGS. 2 and 3A, the outer peripheral conductor 13 is formed separately from the wall body 2, but the outer peripheral conductor 13 may be formed integrally with the wall body 2.

The dielectric 12 has a first end face S1 facing the transmission line 20. The first end face S1 may be a surface substantially perpendicular to the longitudinal direction of the central conductor 11. The dielectric 12 may be composed of glass, for example, or may be composed of other materials. The relative dielectric constant of the dielectric 12 may be 3 or larger.

The wall body 2 includes an opening H1 leading to the first end face S1 of the dielectric 12. The opening H1 may be a part of a through-hole H0 (see FIG. 2) where the coaxial line 10 is arranged. The opening H1 may have a circular shape with a cross section perpendicular to the longitudinal direction of the central conductor 11 and centered at the central conductor 11. The opening H1 may vary in diameter in a stair-like manner from the side closer to the transmission line 20 to the side closer to the first end face S1. The diameter on the side closer to the dielectric 12 may be larger than the diameter on the opposite side.

The opening H1 includes an annular space R. The annular space R corresponds to a portion of the internal space of the opening H1 obtained by removing an area where the central conductor 11 is located from a larger diameter portion. That is, the annular space R is in contact with the first end face S1, and furthermore, the outer diameter of the annular space R is larger than the outer diameter of the space located opposite the first end face S1 in the opening H1. The outer diameter of the annular space R may be substantially equal to the inner diameter of the outer peripheral conductor 13. The annular space R reduces the large distortion of the electric field distribution of the transmission signal (TEM (Transverse Electro Magnetic) wave) travelling in the dielectric 12 of the coaxial line 10 generated when it exits the dielectric 12 with the first end face S1 as a boundary.

As illustrated in FIG. 3B, the central conductor 11 includes a first section Se1 with a first thickness $\varphi1$ and a second section Se2 with a second thickness $\varphi2$ smaller than the first thickness $\varphi1$. The central conductor 11 has a circular shape in a cross section perpendicular to the longitudinal direction, and the first thickness $\varphi1$ and the second thickness $\varphi2$ may each be rephrased as diameter. If the shape in a cross section perpendicular to the longitudinal direction of the central conductor 11 is other than a circle, the first thickness $\varphi1$ and the second thickness $\varphi2$ may mean the maximum width or the average width (the average width=(maximum width+minimum width)/2). In the present description, the first thickness and the second thickness mean a quantity having a unit of length.

At least a part of the first section Se1 of the central conductor 11 projects from the first end face S1 of the dielectric 12 to the outside of the opening H1. The part of the first section Se1 that projects to the outside of the opening H1 is connected to the signal conductor 22 of the transmission line 20. The central conductor 11 may be connected to the signal conductor 22 via a conductive member e (see FIG. 2) or directly connected to the signal conductor 22. The first section Se1 may include a rounded tip on the projection side and may have the same shape and dimensions in a cross section at any position other than the rounded tip along the longitudinal direction. The second section Se2 may have the same shape and dimensions in a cross section at any position within the dielectric 12 along the longitudinal direction. In the following description, the side closer to the transmission line 20 in the longitudinal direction of the central conductor 11 is referred to as the "projection side" and the opposite side is referred to as the "anti-projection side".

In the longitudinal direction of the central conductor 11, an end E1 of the first section Se1 on the anti-projection side may be located between a specific position p1 within the dielectric 12 and the first end face S1. In the present description, when reference is made to an arrangement in which B is located between C and D in the A direction, such an arrangement shall include a case in which the position of B coincides with the position of C in the A direction and a case in which the position of B coincides with the position of D in the A direction.

The specific position p1 is a position separated from the first end face S1 by ⅛ of the effective wavelength of the transmission signal. The distance from the first end face S1 to the specific position p1 is sufficiently short relative to the effective wavelength of the transmission signal.

An inner diameter φ4 of the outer peripheral conductor 13 is set to match a predetermined impedance according to the second thickness φ2 of the second section Se2 of the central conductor 11 and the relative dielectric constant of the dielectric 12. An inner diameter φ3 of the opening H1 is set to match a predetermined impedance according to the first thickness φ1 of the first section Se1 of the central conductor 11.

In the central conductor 11, the first thickness φ1 of the first section Se1 may be not more than twice the second thickness φ2 of the second section Se2. The first thickness φ1 may be more than twice but not more than three times the second thickness φ2. The inner diameter 44 of the outer peripheral conductor 13 may be not more than twice the inner diameter 43 of the opening H1. With the above-described ratios, the abrupt change of the electric field distribution of the transmission signal with the end of the coaxial line 10 as a boundary is reduced, thereby reducing the degradation of the transmission characteristics.

<Signal Transmission Characteristics>

Simulation results of the signal transmission characteristics of Embodiments 1 to 7 and Comparative Examples 1 to 8 are described below. Embodiments 1 to 7 and Comparative Examples 1 to 8, which are simulation subjects, have the following configuration. First, the shape of the central conductor 11 in a cross section perpendicular to the axial direction is circular, and the inner surface of the outer peripheral conductor 13 is cylindrical. Furthermore, the parameters of the periphery of the connection portion between the coaxial line 10 and the transmission line 20 are set so as to match the impedance, assuming that the frequency of the transmission signal is in the 80 GHz band. That is, the inner diameter φ4 of the outer peripheral conductor 13 is set to match the second thickness φ2 of the second section Se2 of the central conductor 11, and the smaller inner diameter φ3 of the opening H1 is set to match the first thickness φ1 of the first section Se1 of the central conductor 11. Furthermore, the configuration of each of the simulation subjects, including Comparative Examples 1 to 8, includes the annular space R.

Embodiments 1 to 7 and Comparative Examples 1 to 8 differ in several parameters of the periphery of the connection portion between the coaxial line 10 and the transmission line 20. The different parameters are the first thickness φ1 of the first section Se1, the second thickness φ2 of the second section Se2, and the position of the end E1 of the first section Se1 on the anti-projection side, of the central conductor 11.

In the following description, the value of the first thickness φ1 of the first section Se1 is represented by "φ1" and the value of the second thickness φ2 of the second section Se2 is represented by "φ2". Furthermore, the position of the end E1 of the first section Se1 on the anti-projection side is represented by the distance "D" from the first end face S1 (see FIG. 3A). When the distance "D" is positive, it indicates that the end E1 is separated from the first end face S1 toward the inside of the dielectric 12, and when the distance "D" is negative, it indicates that the end E1 is separated from the first end face S1 toward the outside of the dielectric 12.

<Thicknesses of First Section Se1 and Second Section Se2>

Figure 4A:
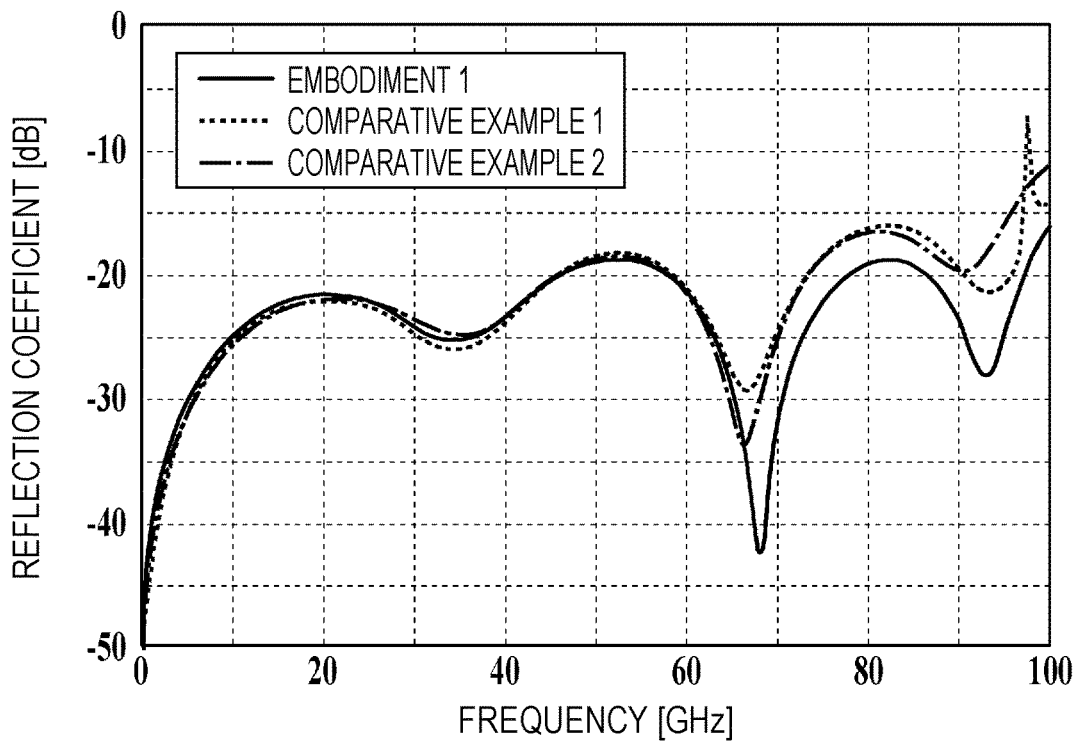
FIG. 4A is a graph showing the frequency characteristics of reflection coefficients of Embodiment 1 and Comparative Examples 1 and 2.
Figure 4B:
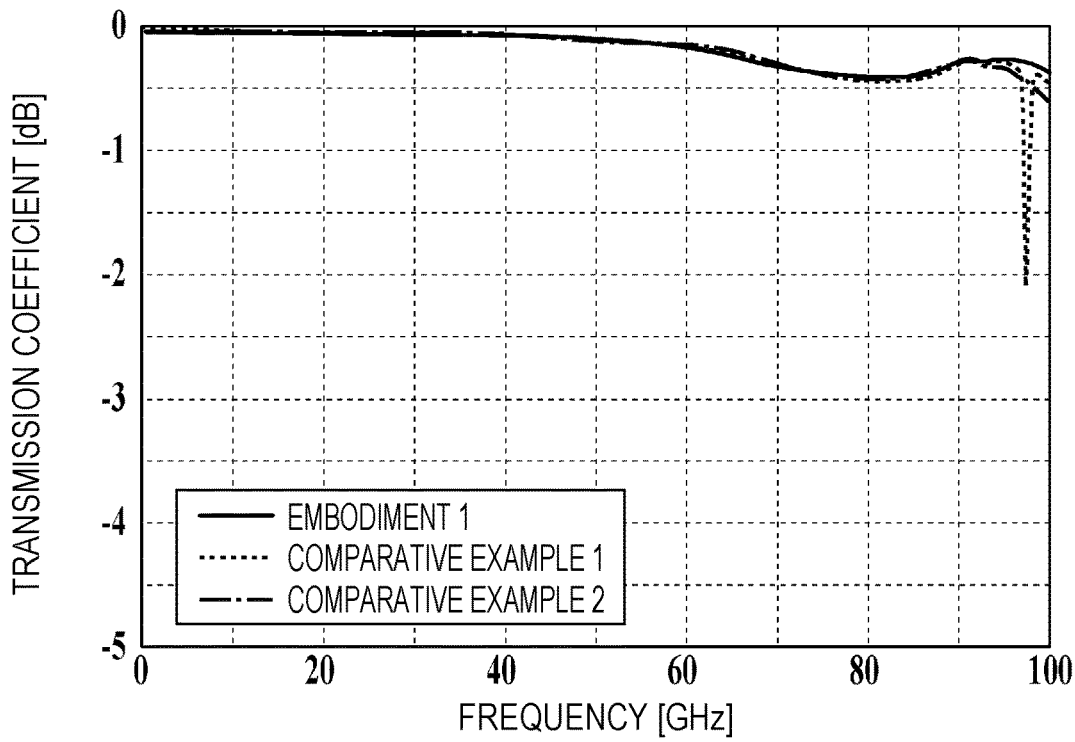
FIG. 4B is a graph showing the frequency characteristics of transmission coefficients of Embodiment 1 and Comparative Examples 1 and 2.

FIGS. 4A and 4B are graphs showing the characteristics of Embodiment 1 and Comparative Examples 1 and 2, wherein FIG. 4A shows the frequency characteristics of the reflection coefficient and FIG. 4B shows the frequency characteristics of the transmission coefficient. The parameters in each of Embodiment 1 and Comparative Examples 1 and 2 are as follows.

$\varphi1 = 0.22$ mm, $\varphi2 = 0.15$ mm, $D = 0$ mm     Embodiment 1

$\varphi1 = \varphi2 = 0.22$ mm     Comparative Example 1

$\varphi1 = \varphi2 = 0.15$ mm     Comparative Example 2

Comparative Examples 1 and 2 are examples where the thickness of the central conductor 11 is constant over the inside and outside of the dielectric 12. On the other hand, Embodiment 1 has a structural difference between the first thickness φ1 of the first section Se1 of the central conductor 11 and the second thickness φ2 of the second section Se2 of the central conductor 11, and such structural difference is that the first thickness φ1 and the second thickness φ2 are different from each other and the first thickness φ1 is larger than the second thickness φ2.

FIG. 4A shows that the reflection coefficient in the 80 GHz band is about −16 dB in Comparative Examples 1 and 2 and equal to or lower than −18 dB in Embodiment 1, which has the above structural difference. Such results indicate that good reflection characteristics can be obtained in the high frequency band according to Embodiment 1 with the above structural difference.

FIG. 4B shows that the transmission coefficient in the 80 GHz band is higher in Embodiment 1 than in Comparative Examples 1 and 2. Such results indicate that good transmission characteristics can be obtained in the high frequency band according to Embodiment 1.

<Ratio of Thickness of First Section Se1 to Thickness of Second Section Se2>

Figure 5A:
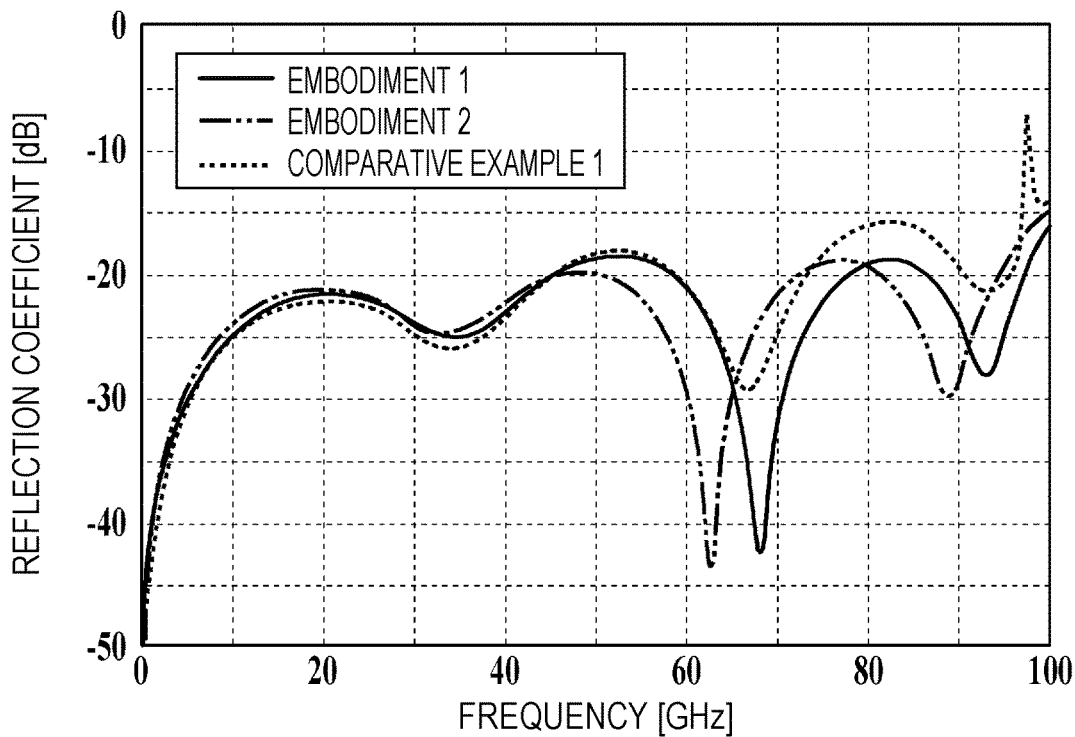
FIG. 5A is a graph showing the frequency characteristics of reflection coefficients of Embodiments 1 and 2 and Comparative Example 1.
Figure 5B:
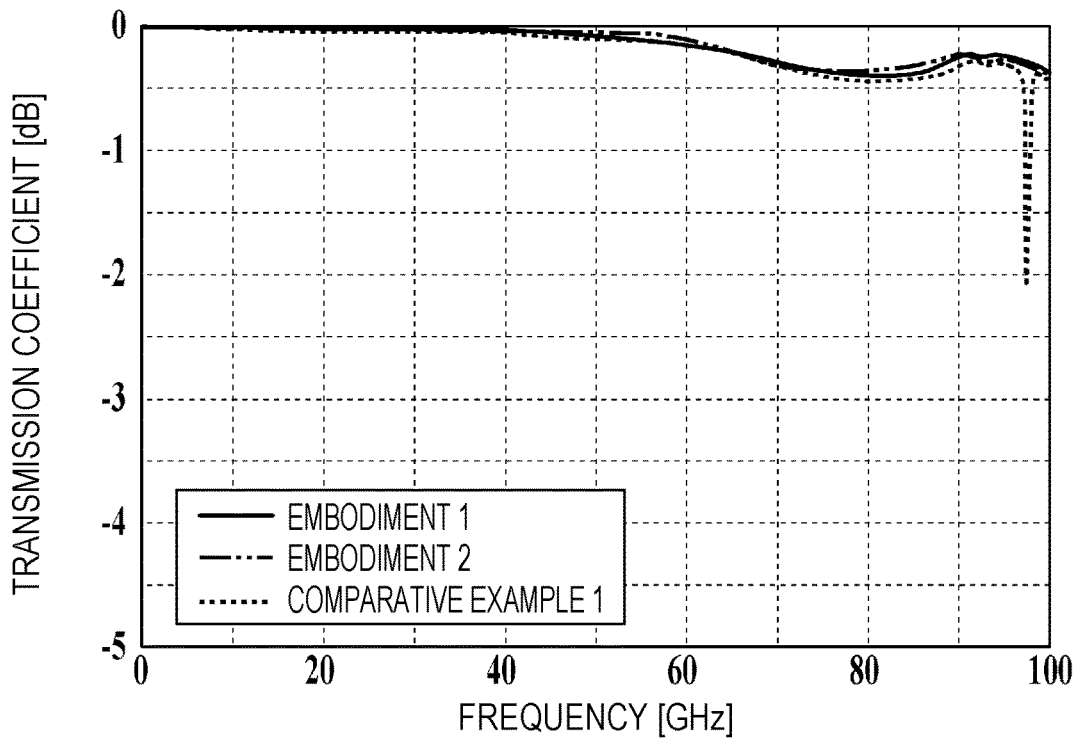
FIG. 5B is a graph showing the frequency characteristics of transmission coefficients of Embodiments 1 and 2 and Comparative Example 1.

FIGS. 5A and 5B are graphs showing the characteristics of Embodiments 1 and 2 and Comparative Example 1, wherein FIG. 5A shows the frequency characteristics of the reflection coefficient and FIG. 5B shows the frequency characteristics of the transmission coefficient. The parameters in each of Embodiments 1 and 2 and Comparative Example 1 are as follows.

$\varphi1 = 0.22$ mm, $\varphi2 = 0.15$ mm, $D = 0$ mm     Embodiment 1

$\varphi1 = 0.22$ mm, $\varphi2 = 0.1$ mm, $D = 0$ mm     Embodiment 2

$\varphi1 = \varphi2 = 0.22$ mm     Comparative Example 1

In Embodiment 2, the first thickness φ1 of the first section Se1 of the central conductor 11 is more than twice but not more than three times the second thickness φ2 of the second section Se2. In the above-described Embodiment 1, the first thickness φ1 of the first section Se1 of the central conductor 11 is not more than twice the second thickness φ2 of the second section Se2.

FIG. 5A shows that the reflection coefficient in the 80 GHz band is equal to or lower than −18 dB in both Embodiment 1 and Embodiment 2. Such results indicate that good reflection characteristics can be obtained in the high frequency band, whether in Embodiment 1, where the ratio of the first thickness φ1 to the second thickness φ2 is not more than 2, or in Embodiment 2, where the ratio of the first thickness φ1 to the second thickness φ2 is from 2 to 3.

FIG. 5B shows that the transmission coefficients in the 80 GHz band in Embodiment 1 and Embodiment 2 are higher than in Comparative Example 1. Such results indicate that good transmission characteristics can be obtained in the high frequency band according to Embodiment 1 and Embodiment 2 with the above ratio of the first thickness φ1 to the second thickness φ2.

<Position of End E1 of First Section Se1 on Anti-Projection Side>

Figure 6A:
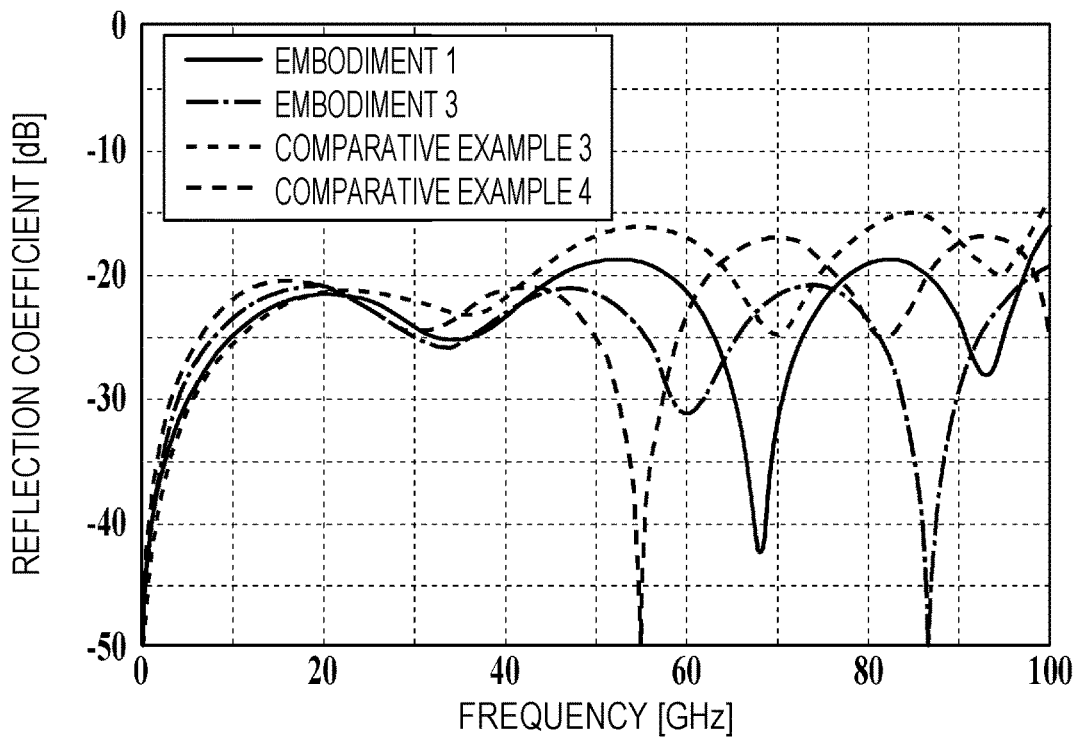
FIG. 6A is a graph showing the frequency characteristics of reflection coefficients of Embodiments 1 and 3 and Comparative Examples 3 and 4.
Figure 6B:
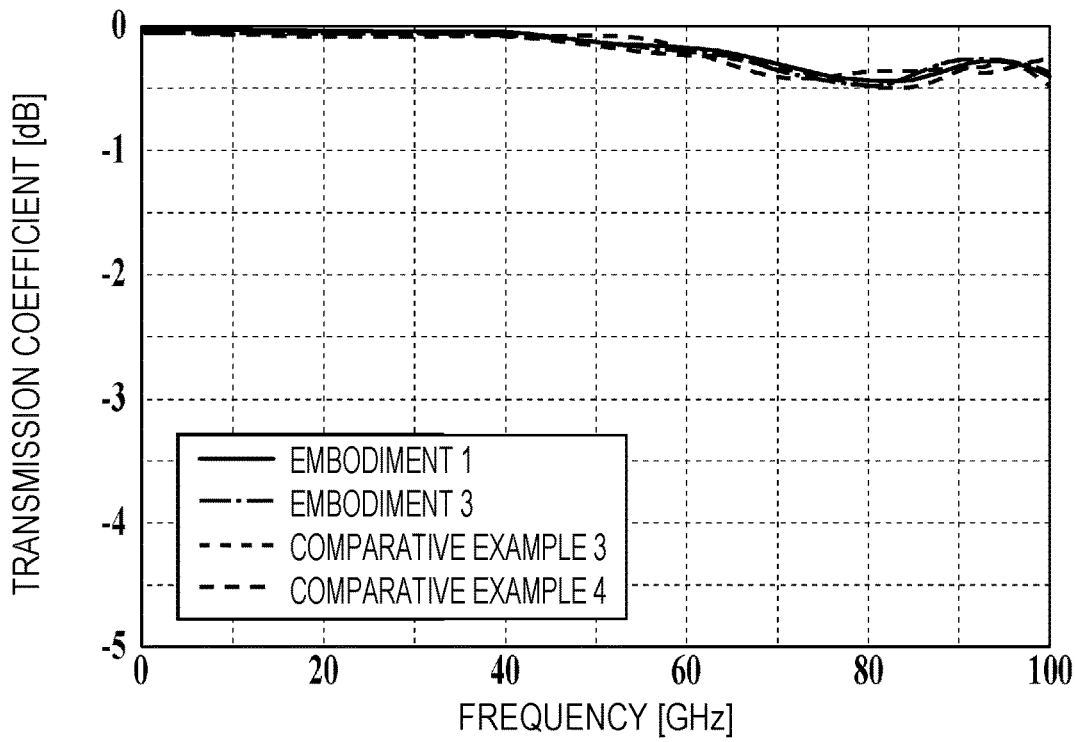
FIG. 6B is a graph showing the frequency characteristics of transmission coefficients of Embodiments 1 and 3 and Comparative Examples 3 and 4.

FIGS. 6A and 6B are graphs showing the characteristics of Embodiments 1 and 3 and Comparative Examples 3 and 4, wherein FIG. 6A shows the frequency characteristics of the reflection coefficient and FIG. 6B shows the frequency characteristics of the transmission coefficient. The parameters in each of Embodiments 1 and 3 and Comparative Examples 3 and 4 are as follows.

| | |
|---|---|
| φ1 = 0.22 mm, φ2 = 0.15 mm, D = 0 mm | Embodiment 1 |
| φ1 = 0.22 mm, φ2 = 0.15 mm, D = 0.1 mm | Embodiment 3 |
| φ1 = 0.22 mm, φ2 = 0.15 mm, D = −0.1 mm | Comparative Example 3 |
| φ1 = 0.22 mm, φ2 = 0.15 mm, D = 0.2 mm | Comparative Example 4 |

Comparative Examples 3 and 4 are an example in which the end E1 of the first section Se1 of the central conductor 11 on the anti-projection side is outside the dielectric 12 (a position closer to the transmission line 20 than to the first end face S1), and an example in which the end E1 is separated far away from the first end face S1 toward the inside of the dielectric 12.

On the other hand, in Embodiments 1 and 3, the end E1 of the first section Se1 of the central conductor 11 on the anti-projection side is located at a suitable position within the dielectric 12 from the first end face S1 of the dielectric 12 in the longitudinal direction of the central conductor 11.

FIG. 6A shows that the maximum reflection coefficient in the 70 GHz to 90 GHz band is about −15 dB and −16 dB in Comparative Examples 3 and 4, respectively, and equal to or lower than −18 dB and equal to or lower than −21 dB in Embodiments 1 and 3, respectively. Such results show that according to Embodiments 1 and 3, where the end E1 of the first section Se1 is located within the above-described ranges of the dielectric 12, good reflection characteristics can be obtained in the high frequency band. Furthermore, such results show that according to Embodiment 3, where the end E1 of the first section Se1 is located in the dielectric 12 within an appropriate range, better reflection characteristics can be obtained in the high frequency band.

FIG. 6B shows that the transmission coefficients in the 70 GHz to 90 GHz band are higher in Embodiments 1 and 3 than in Comparative Examples 3 and 4. Such results indicate that good transmission characteristics can be obtained in the high frequency band according to Embodiments 1 and 3.

<Detail 1 of Position of End E1 of the First Section Se1 on Anti-Projection Side>

Figure 7A:
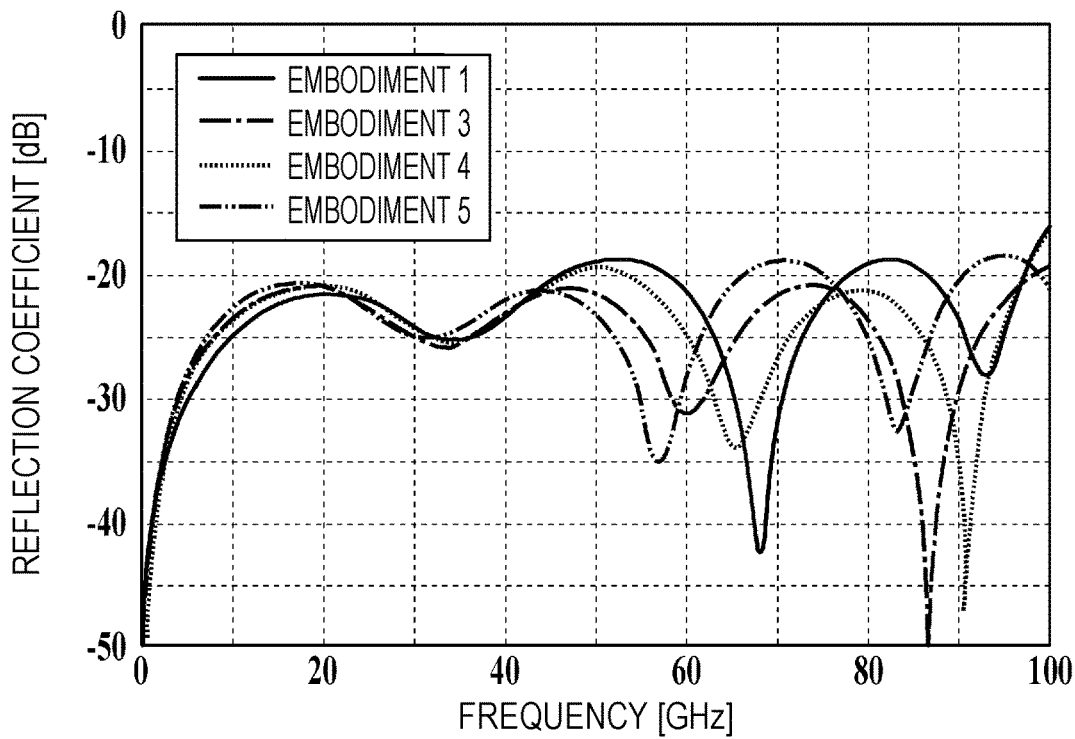
FIG. 7A is a graph showing the frequency characteristics of reflection coefficients of Embodiments 1 and 3 to 5.
Figure 7B:
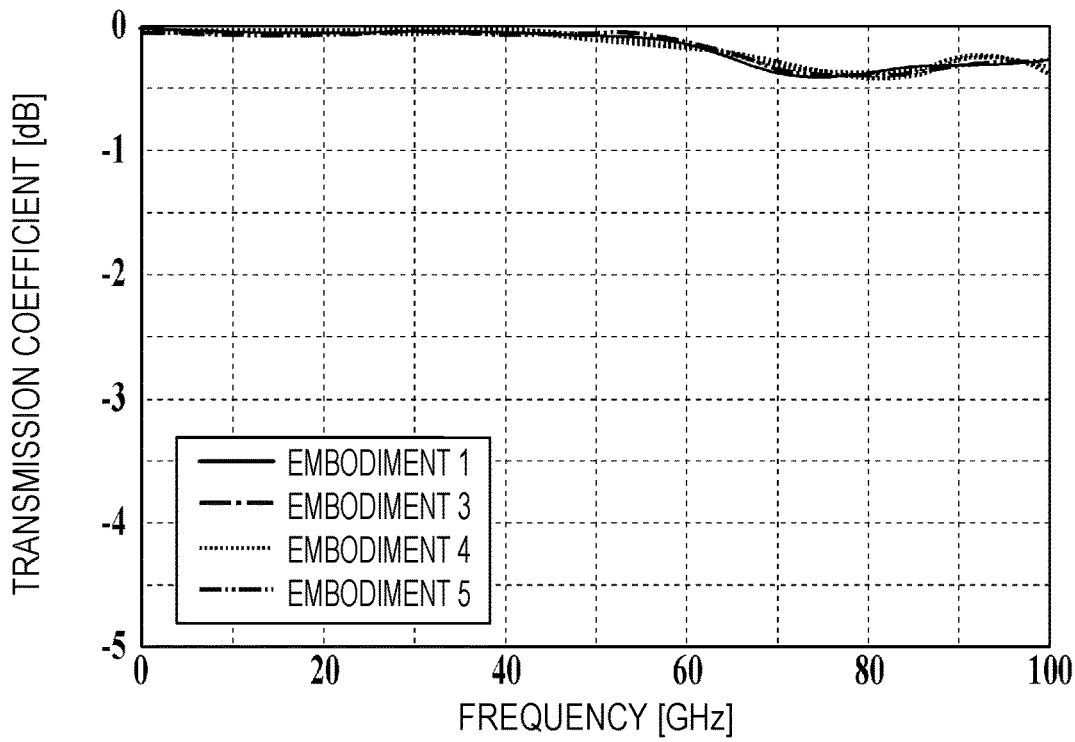
FIG. 7B is a graph showing the frequency characteristics of transmission coefficients of Embodiments 1 and 3 to 5.

FIGS. 7A and 7B are graphs showing the characteristics of Embodiments 1 and 3 to 5, wherein FIG. 7A shows the frequency characteristics of the reflection coefficient and FIG. 7B shows the frequency characteristics of the transmission coefficient. The parameters in each of Embodiments 1 and 3 to 5 are as follows.

| | |
|---|---|
| φ1 = 0.22 mm, φ2 = 0.15 mm, D = 0 mm | Embodiment 1 |
| φ1 = 0.22 mm, φ2 = 0.15 mm, D = 0.1 mm | Embodiment 3 |
| φ1 = 0.22 mm, φ2 = 0.15 mm, D = 0.05 mm | Embodiment 4 |
| φ1 = 0.22 mm, φ2 = 0.15 mm, D = 0.15 mm | Embodiment 5 |

In Embodiments 1 and 3 to 5, the end E1 of the first section Se1 of the central conductor 11 on the anti-projection side is located between the first end face S1 and the specific position p1 (see FIG. 3) within the dielectric 12 in the longitudinal direction of the central conductor 11. As described above, the specific position p1 is a position separated from the first end face S1 by ⅛ of the effective wavelength of the transmission signal; when the frequency of the transmission signal is 80 GHz and the relative dielectric constant of the dielectric 12 is 6, the distance from the first end face S1 to the specific position p1 is about 0.19 mm.

Furthermore, in Embodiments 1 and 3 to 5, the ratio of the thickness of the first section Se1 to the thickness of the second section Se2 of the central conductor 11 is not more than 2.

FIG. 7A shows that the maximum reflection coefficient in the 70 GHz to 90 GHz band is equal to or lower than −18 dB in all of Embodiments 1 and 3 to 5. Such results indicate that good reflection characteristics can be obtained in the high frequency band according to Embodiments 1 and 3 to 5, where the end E1 of the first section Se1 is located between the first end face S1 and the specific position p1 in the longitudinal direction of the central conductor 11.

FIG. 7B shows that the minimum transmission coefficient in the 70 GHz to 90 GHz band is equal to or higher than −0.5 dB in Embodiments 1 and 3 to 5. Such results indicate that good transmission characteristics can be obtained in the high frequency band according to Embodiments 1 and 3 to 5.

<Position of End E1 of First Section Se1 on Anti-Projection Side (when Second Section Se2 is Thin)>

Figure 8A:
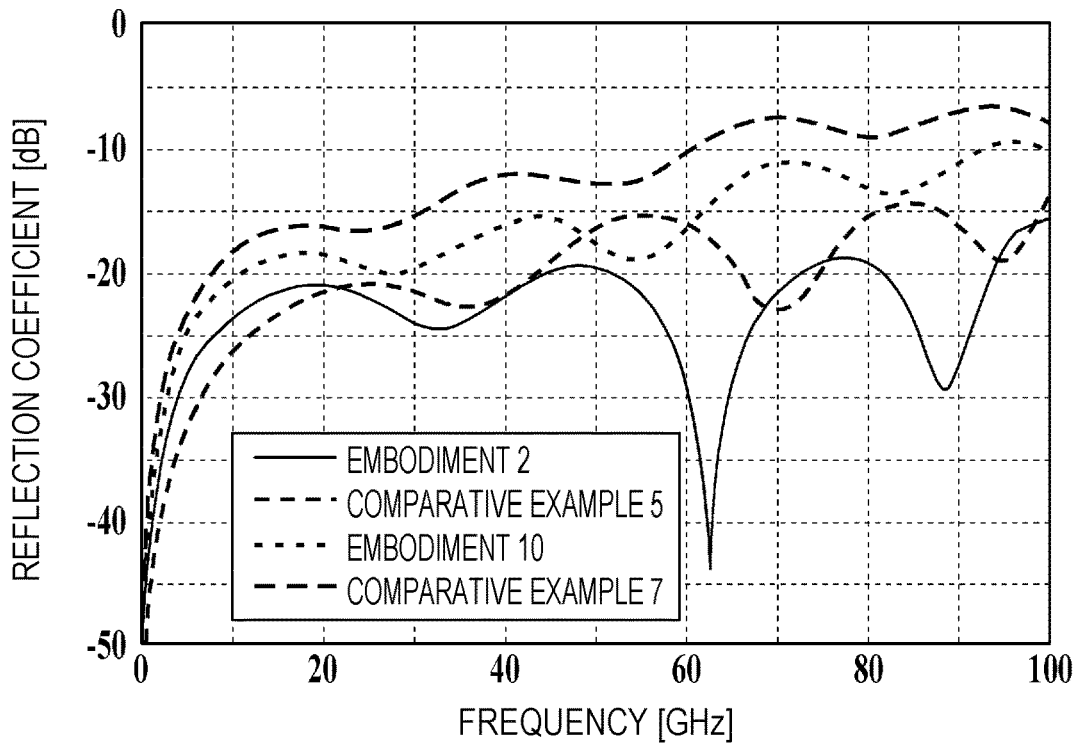
FIG. 8A is a graph showing the frequency characteristics of reflection coefficients of Embodiments 2 and 10 and Comparative Examples 5 and 7.
Figure 8B:
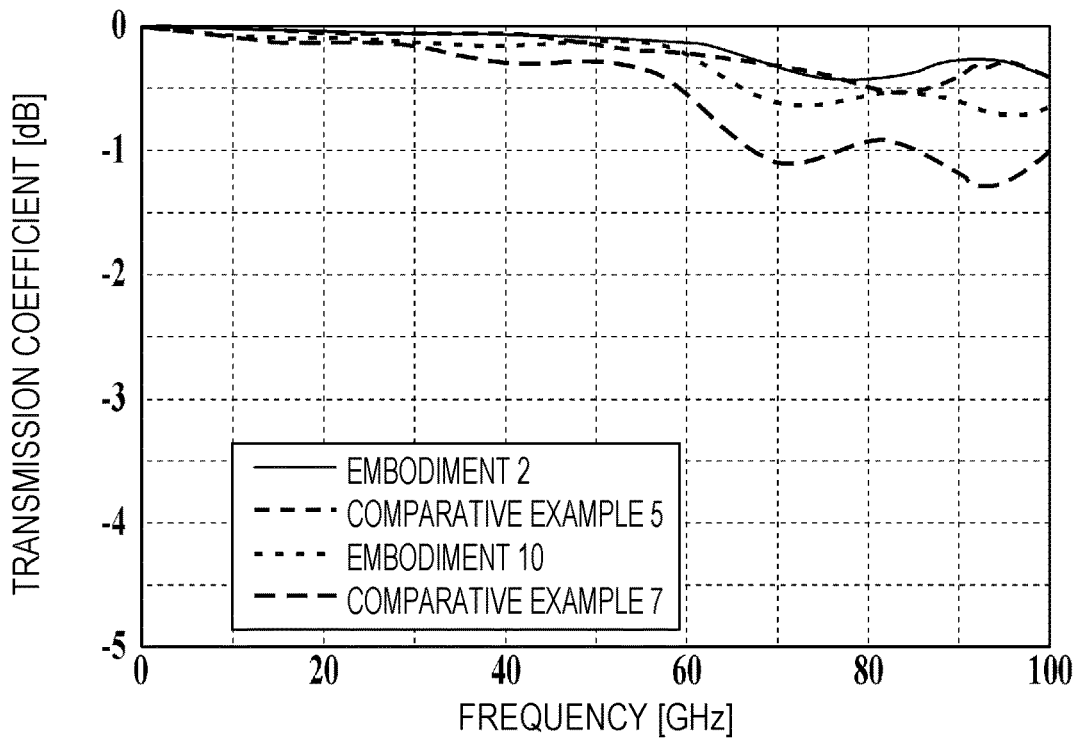
FIG. 8B is a graph showing the frequency characteristics of transmission coefficients of Embodiments 2 and 10 and Comparative Examples 5 and 7.

FIGS. 8A and 8B are graphs showing the characteristics of Embodiments 2 and 10 and Comparative Examples 5 and 7, wherein FIG. 8A shows the frequency characteristics of the reflection coefficient and FIG. 8B shows the frequency characteristics of the transmission coefficient. The parameters in each of Embodiments 2 and 10 and Comparative Examples 5 and 7 are as follows.

| | |
|---|---|
| φ1 = 0.22 mm, φ2 = 0.10 mm, D = 0 mm | Embodiment 2 |
| φ1 = 0.22 mm, φ2 = 0.10 mm, D = −0.1 mm | Comparative Example 5 |
| φ1 = 0.22 mm, φ2 = 0.10 mm, D = 0.1 mm | Embodiment 10 |
| φ1 = 0.22 mm, φ2 = 0.10 mm, D = 0.2 mm | Comparative Example 7 |

In Embodiments 2 and 10 and Comparative Examples 5 and 7, the ratio of the thickness of the first section Se1 to the thickness of the second section Se2 of the central conductor 11 is all more than 2 but not more than 3, while the position of the end E1 of the first section Se1 on the anti-projection side is significantly different from each other. The end E1 of the first section Se1 on the anti-projection side in Embodiment 2 is flush with the first end face of the dielectric 12.

FIG. 8A shows that the maximum reflection coefficient in the 70 GHz to 90 GHz band is equal to or lower than −18 dB in Embodiment 2, while it is equal to or higher than −15 dB in Comparative Examples 5, 7 and Embodiment 10. Such results indicate that good reflection characteristics can be obtained in the high frequency band according to Embodiment 2, in which the ratio of the thickness of the first section Se1 to the thickness of the second section Se2 is from 2 to 3, and the end E1 of the first section Se1 is flush with the first end face S1 of the dielectric 12. Embodiment 2 has relatively better reflection characteristics, but Embodiment 10 also has good reflection characteristics at high frequencies.

FIG. 8B shows that the minimum transmission coefficient in the 70 GHz to 90 GHz band is equal to or lower than −0.5 dB in Comparative Examples 5, 7 and Embodiment 10, while it is about −0.4 dB in Embodiment 2. Such results indicate that good transmission characteristics can be obtained in the high frequency band according to Embodiment 2. Embodiment 2 has relatively better transmission characteristics, but Embodiment 10 also has good transmission characteristics at high frequencies.

<Details of Position of End E1 of First Section Se1 on Anti-Projection Side (when Second Section Se2 is Thin)>

Figure 9A:
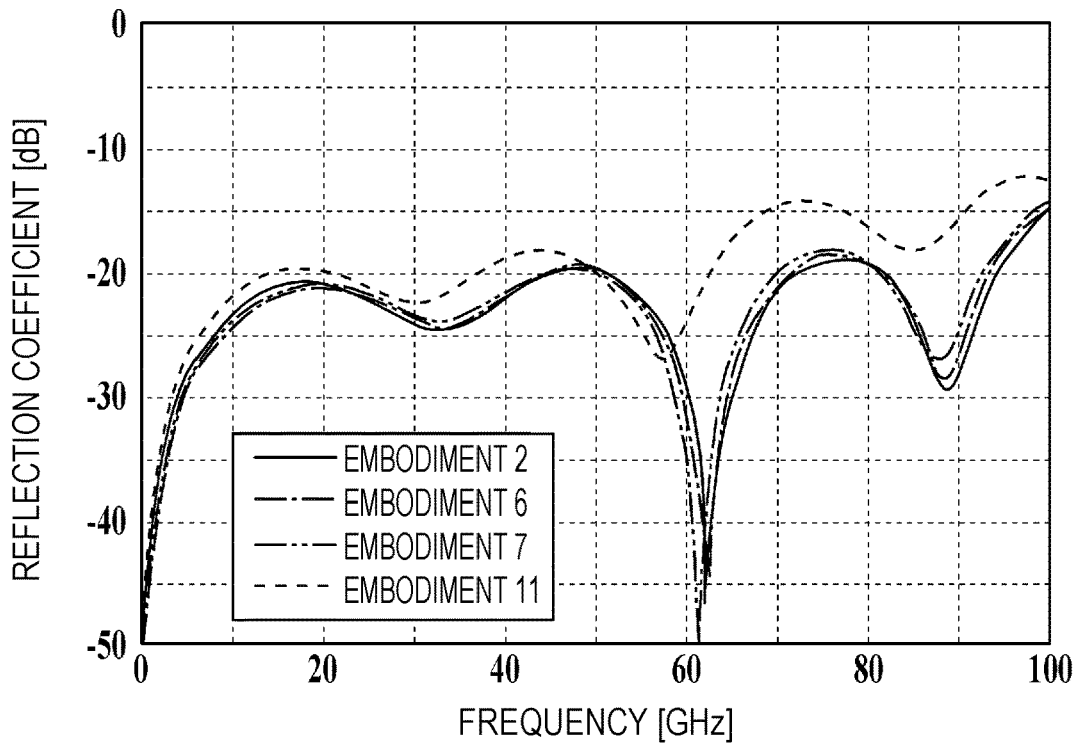
FIG. 9A is a graph showing the frequency characteristics of reflection coefficients of Embodiments 2, 6, 7, and 11.
Figure 9B:
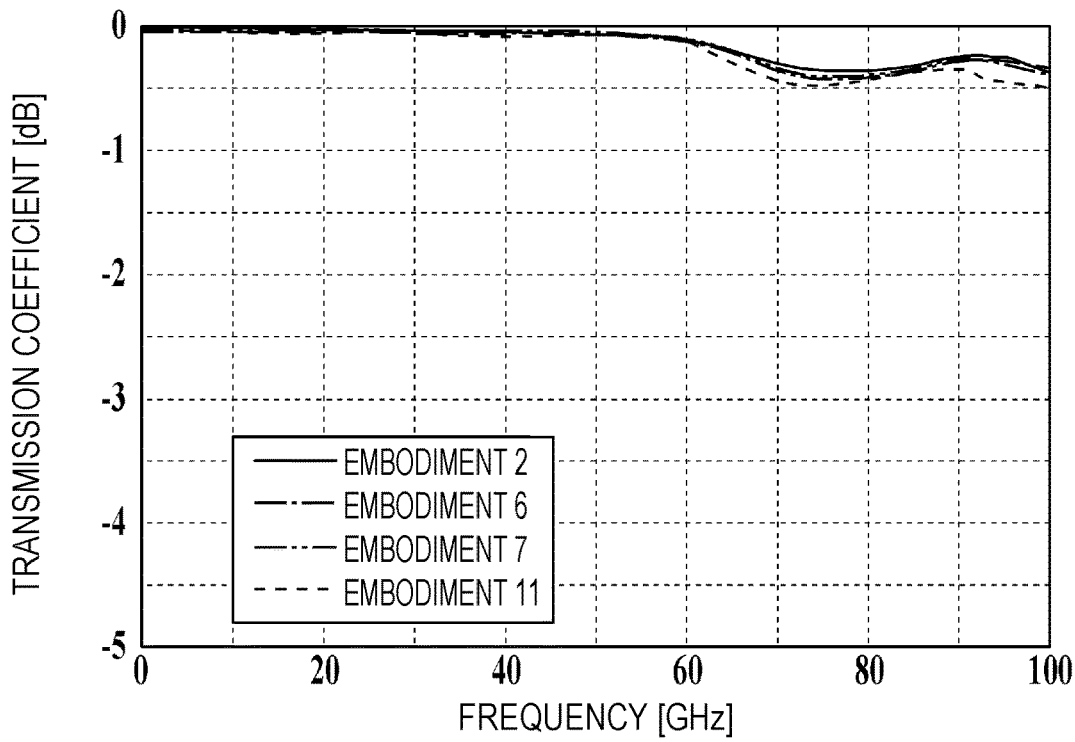
FIG. 9B is a graph showing the frequency characteristics of transmission coefficients of Embodiments 2, 6, 7, and 11.

FIGS. 9A and 9B are graphs showing the characteristics of Embodiments 2, 6, 7, and 11, wherein FIG. 9A shows the frequency characteristics of the reflection coefficient and FIG. 9B shows the frequency characteristics of the transmission coefficient. The parameters in each of Embodiments 2, 6, 7, and 11 are as follows.

| | |
|---|---|
| $\varphi 1 = 0.22$ mm, $\varphi 2 = 0.10$ mm, $D = 0$ mm | Embodiment 2 |
| $\varphi 1 = 0.22$ mm, $\varphi 2 = 0.10$ mm, $D = 0.01$ mm | Embodiment 6 |
| $\varphi 1 = 0.22$ mm, $\varphi 2 = 0.10$ mm, $D = 0.02$ mm | Embodiment 7 |
| $\varphi 1 = 0.22$ mm, $\varphi 2 = 0.10$ mm, $D = 0.05$ mm | Embodiment 11 |

In Embodiments 2, 6, 7, and 11, the ratio of the thickness of the first section Se1 to the thickness of the second section Se2 of the central conductor 11 is all more than 2 but not more than 3, while the position of the end E1 of the first section Se1 on the anti-projection side is finely different from each other. In Embodiments 2, 6, and 7, the end E1 of the first section Se1 on the anti-projection side is located within 3% of the effective wavelength of the transmission signal from the first end face S1.

FIG. 9A shows that the maximum reflection coefficient in the 70 GHz to 90 GHz band is equal to or lower than −18 dB in Embodiments 2, 6, and 7, while it is equal to or higher than −15 dB in Embodiment 11. Such results indicate that good reflection characteristics can be obtained in the high frequency band according to Embodiments 2, 6, and 7, where the ratio of the thickness of the first section Se1 to the second section Se2 is from 2 to 3, and the end E1 of the first section Se1 is located within 3% of the effective wavelength of the transmission signal from the first end face S1 within the dielectric 12. Embodiments 2, 6, and 7 have relatively better reflection characteristics, but Embodiment 11 also has good reflection characteristics at high frequencies.

FIG. 9B shows that the transmission coefficient in the 70 GHz to 90 GHz band is higher in Embodiments 2, 6, and 7 than in Embodiment 11. Such results indicate that good transmission characteristics can be obtained in the high frequency band according to Embodiments 2, 6, and 7. Embodiments 2, 6, and 7 have relatively better transmission characteristics, but Embodiment 11 also has good transmission characteristics at high frequencies.

Variation

Figure 10A:
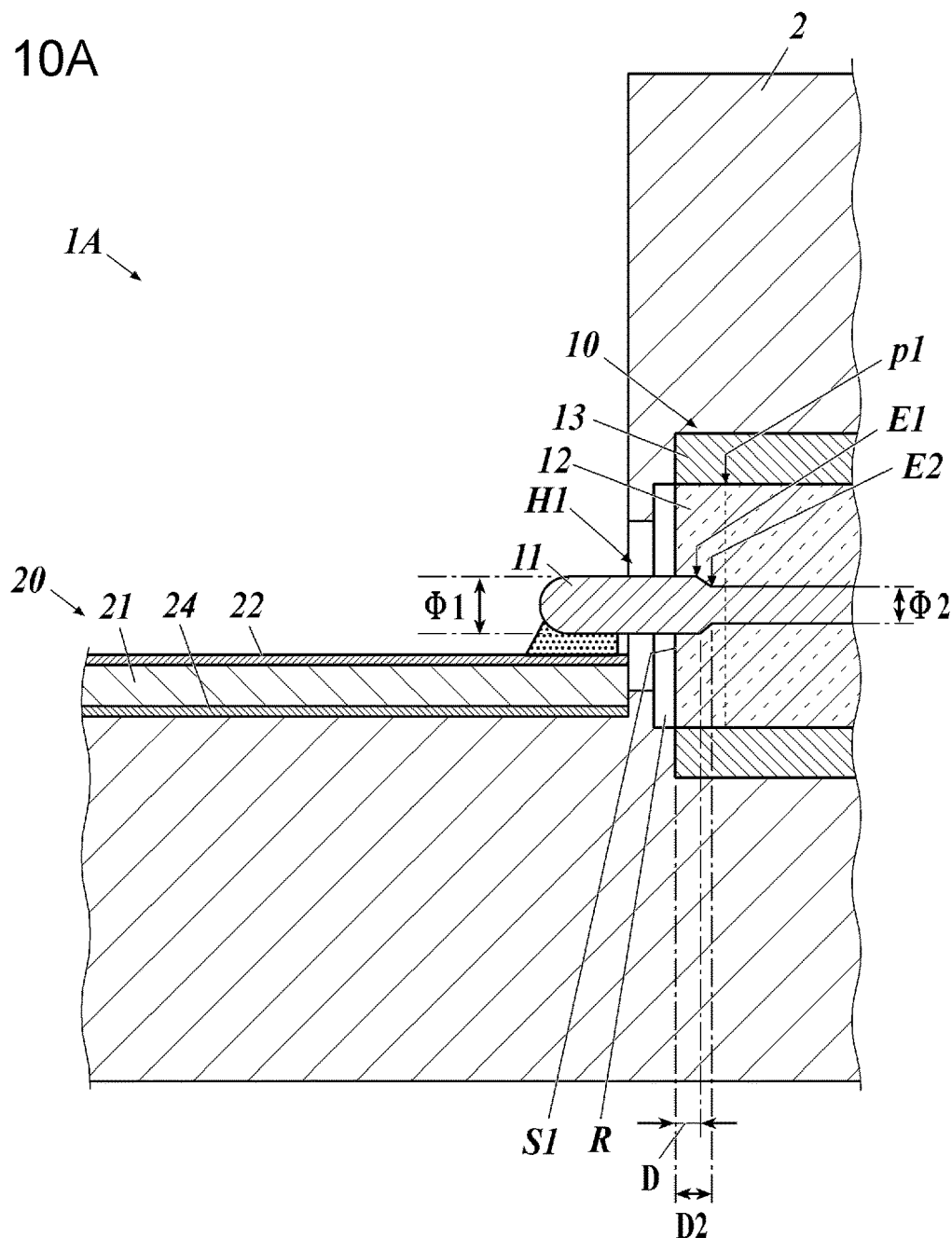
FIG. 10A is a sectional view illustrating a coaxial line and a transmission line of an electronic element storing package according to a variation of the embodiment of the present disclosure.
Figure 10B:
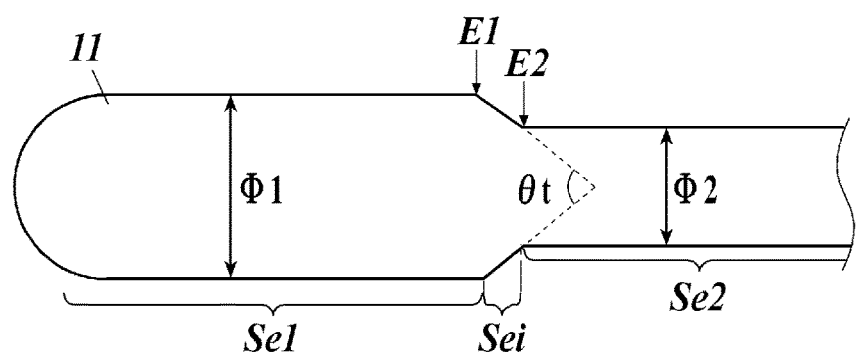
FIG. 10B is a view illustrating a central conductor of the electronic element storing package according to the variation of the embodiment of the present disclosure.

FIG. 10A is a sectional view of a coaxial line and a transmission line of an electronic element storing package according to a variation of the embodiment of the present disclosure. FIG. 10B is a view of a central conductor of the electronic element storing package of the variation. As illustrated in FIG. 10B, a central conductor 11 may include an intermediate section Sei with a taper between a first section Se1 and a second section Se2. An electronic element storing package 1A of the variation may include the same and/or similar components of Embodiments 1 to 7, except that it further includes the intermediate section Sei.

The thickness of the intermediate section Sei varies progressively at the same rate along the longitudinal direction of the central conductor 11. The thickness of the intermediate section Sei is equal to a first thickness q 1 of the first section Se1 at the boundary (an end E1 of the first section Se1) between the first section Se1 and the intermediate section Sei and is equal to a second thickness φ2 of the second section Se2 at a boundary E2 between the second section Se2 and the intermediate section Sei. The intermediate section Sei may have a circular cross section perpendicular to the longitudinal direction of the central conductor 11.

In the electronic element storing package 1A of the variation, the end E1 of the first section Se1 on the anti-projection side is located between the first end face S1 of the dielectric 12 and the above-described specific position p1 in the longitudinal direction of the central conductor 11. In addition, the boundary E2 between the intermediate section Sei and the second section Se2 is located between the end E1 of the first section Se1 and the above-described specific position p1 in the longitudinal direction of the central conductor 11. The boundary E2 can be rephrased as the end of the second section Se2 on the projection side.

<Signal Transmission Characteristics>

Simulation results of the signal transmission characteristics of Embodiments 8 and 9 including the intermediate section Sei are described below. The conditions of the simulations are the same as and/or similar to the simulations of Embodiments 1 to 7 described above, except for the parameters related to the intermediate section Sei. The parameters that differ from Embodiments 1 to 7 include the position of the boundary E2 between the intermediate section Sei and the second section Se2. Similarly to the description in which the position of the end E1 of the first section Se1 on the anti-projection side is represented by the distance "D", in the following description the position of the boundary E2 is represented by the distance "D2" from the first end face S1 of the dielectric 12. Once the two distances "D, D2" and the thicknesses "φ1, φ2" of the first section Se1 and second section Se2 are determined, a taper angle θt (see FIG. 10B) of the intermediate section Sei is determined.

Figure 11A:
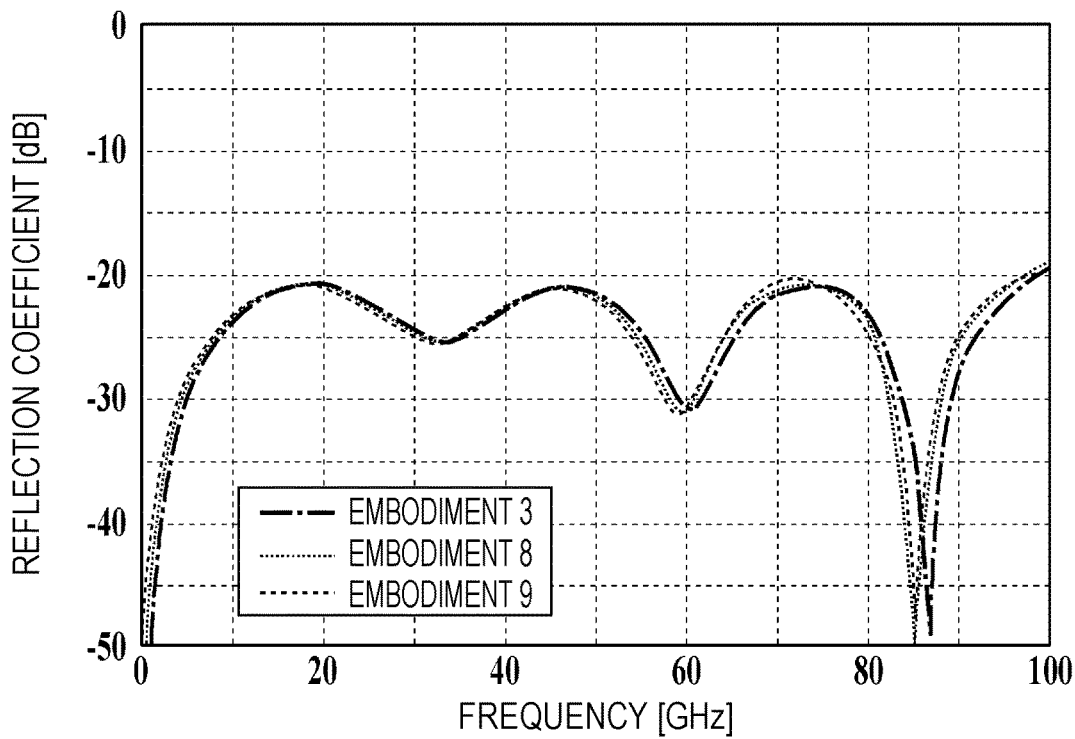
FIG. 11A is a graph showing the frequency characteristics of reflection coefficients of Embodiments 3, 8, and 9.
Figure 11B:
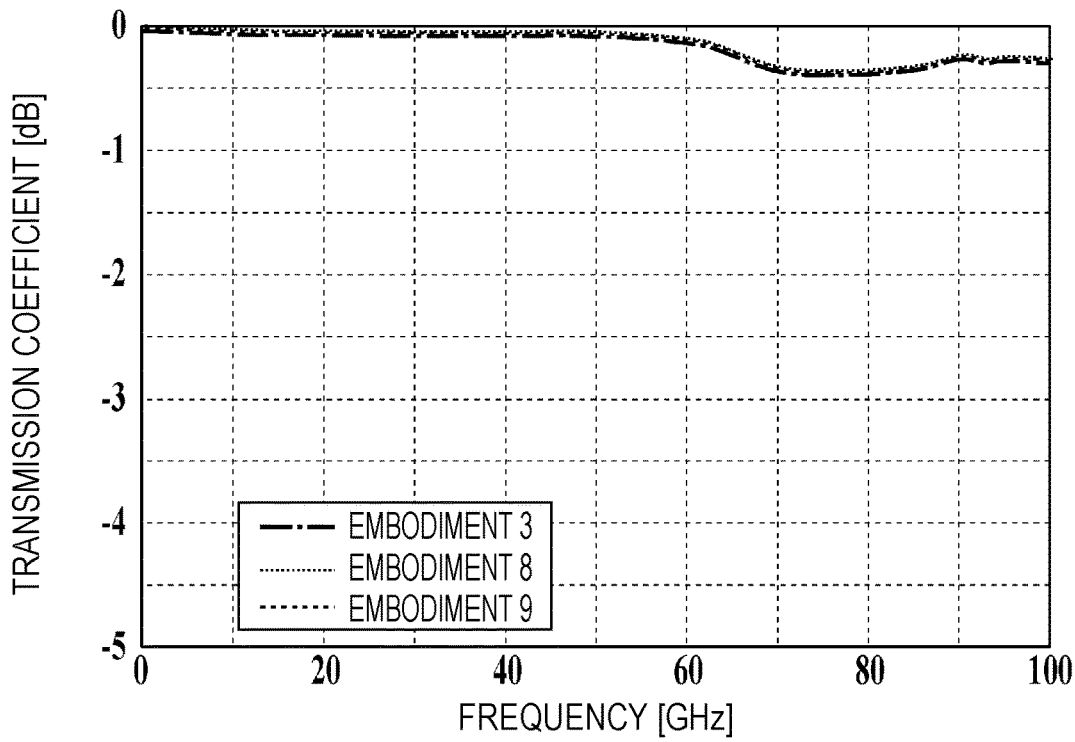
FIG. 11B is a graph showing the frequency characteristics of transmission coefficients of Embodiments 3, 8, and 9.

FIGS. 11A and 11B are graphs showing the characteristics of Embodiments 3, 8, and 9, wherein FIG. 11A shows the frequency characteristics of the reflection coefficient and FIG. 11B shows the frequency characteristics of the transmission coefficient. The parameters in each of Embodiments 3, 8, and 9 are as follows.

$\varphi 1 = 0.22$ mm, $\varphi 2 = 0.15$ mm, $D =$ 0.1 mm (without the intermediate section Sei) — Embodiment 3

$\varphi 1 = 0.22$ mm, $\varphi 2 = 0.15$ mm, $D = 0.1$ mm, $D2 = 0.135$ mm — Embodiment 8

$\varphi 1 = 0.22$ mm, $\varphi 2 = 0.15$ mm, $D = 0.1$ mm, $D2 = 0.15$ mm — Embodiment 9

The taper angle $\theta t$ in Embodiment 8 is equal to 90°, and the taper angle $\theta t$ in Embodiment 9 is equal to 70°. In Embodiment 8 and Embodiment 9, the boundary E2 between the intermediate section Sei and the second section Se2 is located between the first end face S1 and the specific position p1 within the dielectric 12 in the longitudinal direction of the central conductor 11.

FIGS. 9A and 9B show that the reflection coefficients and transmission coefficients in the 70 GHz to 90 GHz band in Embodiments 8 and 9 with the intermediate section Sei are equal to those in Embodiment 3 without the intermediate section Sei. The results indicate that good signal transmission characteristics can be obtained in the high frequency band even in Embodiments 8 and 9, in which the central conductor 11 includes an intermediate section Sei with a taper and the boundary E2 between the intermediate section Sei and the second section Se2 is located within the above-described range.

As described above, the electronic element storing package 1 or 1A of the present embodiments includes the base 4 including the wall body 2, the coaxial line 10 located in the wall body 2, and the transmission line 20 connected to the coaxial line 10 on a side of the wall body 2. The wall body 2 includes the opening H1 leading to the first end face S1 of the dielectric 12 of the coaxial line 10, and the opening H1 includes the annular space R in contact with the first end face S1. Furthermore, the central conductor 11 includes the first section Se1 having the first thickness $\varphi 1$ and including at least a part projecting from the first end face S1, and the second section Se2 having the second thickness $\varphi 2$ smaller than the first thickness $\varphi 1$ and located within the dielectric 12. In the longitudinal direction of the central conductor 11, the end E1 of the first section Se1 on the anti-projection side is located between the specific position p1 within the dielectric 12 and the first end face S1. The specific position p1 is a position separated from the first end face S1 by ⅛ of the effective wavelength of the transmission signal, which is a sufficiently short distance relative to the effective wavelength of the transmission signal. Such a configuration can improve the signal transmission characteristics in the connection portion between the coaxial line 10 and the transmission line 20, even when a signal in the high frequency band is used.

In the electronic element storing package 1 or 1A of the present embodiments, the first thickness $\varphi 1$ of the first section Se1 of the central conductor 11 may be not more than twice the second thickness $\varphi 2$ of the second section Se2. Such a configuration can further improve the signal transmission characteristics in the high frequency band in the connection portion between the coaxial line 10 and the transmission line 20.

Furthermore, as illustrated in the electronic element storing package 1A of the variation, the central conductor 11 may include an intermediate section Sei with a taper between the first section Se1 and the second section Se2. Furthermore, the boundary E2 between the intermediate section Sei and the second section Se2 may be located between the specific position p1 and the first end face S1 in the longitudinal direction of the central conductor 11. Such a configuration can also improve the signal transmission characteristics in the high frequency band in the connection portion between the coaxial line 10 and the transmission line 20.

In the electronic element storing package 1 or 1A of the present embodiments, the transmission line 20 may include the signal conductor 22, and a part of the first section Se1 of the central conductor 11 may project toward the outside from the opening H1 and be connected to the signal conductor 22 directly or via the conductive member e. In the above-described connection portion between the coaxial line 10 and the transmission line 20, the signal transmission characteristics in the high frequency band can be improved according to the electronic element storing package 1 or 1A of the present embodiments.

Furthermore, according to the electronic device 100 of the present embodiments, the signal transmission characteristics of the high frequency band can be improved by employing the electronic element storing package 1 or 1A.

The above is a description of the embodiments of the present disclosure. However, the electronic element storing package and the electronic device of the present disclosure are not limited to the above embodiments and can be changed as needed without departing from the spirit of the present disclosure.

INDUSTRIAL AVAILABILITY

The present disclosure can be used for an electronic element storing package and an electronic device.

REFERENCE SIGNS 1, 1A electronic element storing package
2 wall body
3 storage portion
4 base
5 lid
6 electronic element
10 coaxial line
11 central conductor
12 dielectric
13 outer peripheral conductor
20 transmission line
22 signal conductor
S1 first end face
Se1 first section
Se2 second section
Sei intermediate section
E1 end of first section on anti-projection side
E2 boundary between intermediate section and second section
$\theta t$ taper angle
$\varphi 1$ first thickness
$\varphi 2$ second thickness
p1 specific position
D, D2 distance from first end face
H1 opening
R annular space
$\varphi 3$, $\varphi 4$ diameter
e conductive member
100 electronic device

The invention claimed is:

1. An electronic element storing package comprising:
a base including a wall body;
a coaxial line located in the wall body; and
a transmission line connected to the coaxial line on a side of the wall body,
wherein
the coaxial line includes a central conductor that is long in one direction, an outer peripheral conductor, and a dielectric that is located between the central conductor and the outer peripheral conductor,
the dielectric has a first end face facing the transmission line,
the wall body includes an opening leading to the first end face,
the opening includes an annular space in contact with the first end face,
an outer diameter of the annular space is larger than an outer diameter of a space located on an opposite side of the first end face in the opening,
the central conductor includes a first section having a first thickness and a second section having a second thickness smaller than the first thickness and located within the dielectric, at least a part of the first section projecting from the first end face,
an end of the first section on an anti-projection side is located between the first end face and a specific position within the dielectric in a longitudinal direction of the central conductor, and
the specific position is a position separated from the first end face toward an inside of the dielectric by $1/8$ of an effective wavelength of a transmission signal.

2. The electronic element storing package according to claim 1, wherein the first thickness is not more than twice the second thickness.

3. The electronic element storing package according to claim 1, wherein
the central conductor includes an intermediate section with a taper between the first section and the second section, and
a boundary between the intermediate section and the second section is located between the first end face and the specific position in the longitudinal direction of the central conductor.

4. The electronic element storing package according to claim 1, wherein
the transmission line includes a signal conductor, and
a part of the first section of the central conductor projects toward an outside from the opening and is connected to the signal conductor directly or via a conductive member.

5. An electronic device comprising:
the electronic element storing package according to claim 1; and
an electronic element stored in the electronic element storing package.

* * * * *